(12) United States Patent
Oravsky

(10) Patent No.: US 6,172,514 B1
(45) Date of Patent: Jan. 9, 2001

(54) TEST PROBE RETAINER

(75) Inventor: Timothy W. Oravsky, Trenton, NJ (US)

(73) Assignee: Lucent Technologies Inc., Murray Hill, NJ (US)

( * ) Notice: Under 35 U.S.C. 154(b), the term of this patent shall be extended for 0 days.

(21) Appl. No.: 09/267,853

(22) Filed: Mar. 12, 1999

(51) Int. Cl.$^7$ .................................................. G01R 31/02
(52) U.S. Cl. .......................................... 324/761; 324/754
(58) Field of Search .................................. 324/761, 754, 324/755, 156; 439/482, 824

(56) References Cited

U.S. PATENT DOCUMENTS

| | | | |
|---|---|---|---|
| 3,866,119 | * 2/1975 | Aedezzone et al. ................. | 324/72.5 |
| 4,101,830 | * 7/1978 | Greig ................................... | 324/754 |
| 4,739,259 | * 4/1988 | Hadwin et al. ..................... | 324/72.5 |
| 4,885,533 | * 12/1989 | Coe ..................................... | 439/482 |

\* cited by examiner

*Primary Examiner*—Vinh P. Nguyen
(74) *Attorney, Agent, or Firm*—David L. Davis

(57) ABSTRACT

A retainer for a circuit board test probe includes a unitary member in which the test probe is inserted. The retainer may then be plugged into a desired opening in a test fixture plate, with a circumferential bead on the retainer and a circumferential groove in the plate opening providing a snap-in feature. Inward compression of the retainer moves the bead out of the groove to allow the retainer to be removed from the plate opening.

3 Claims, 2 Drawing Sheets

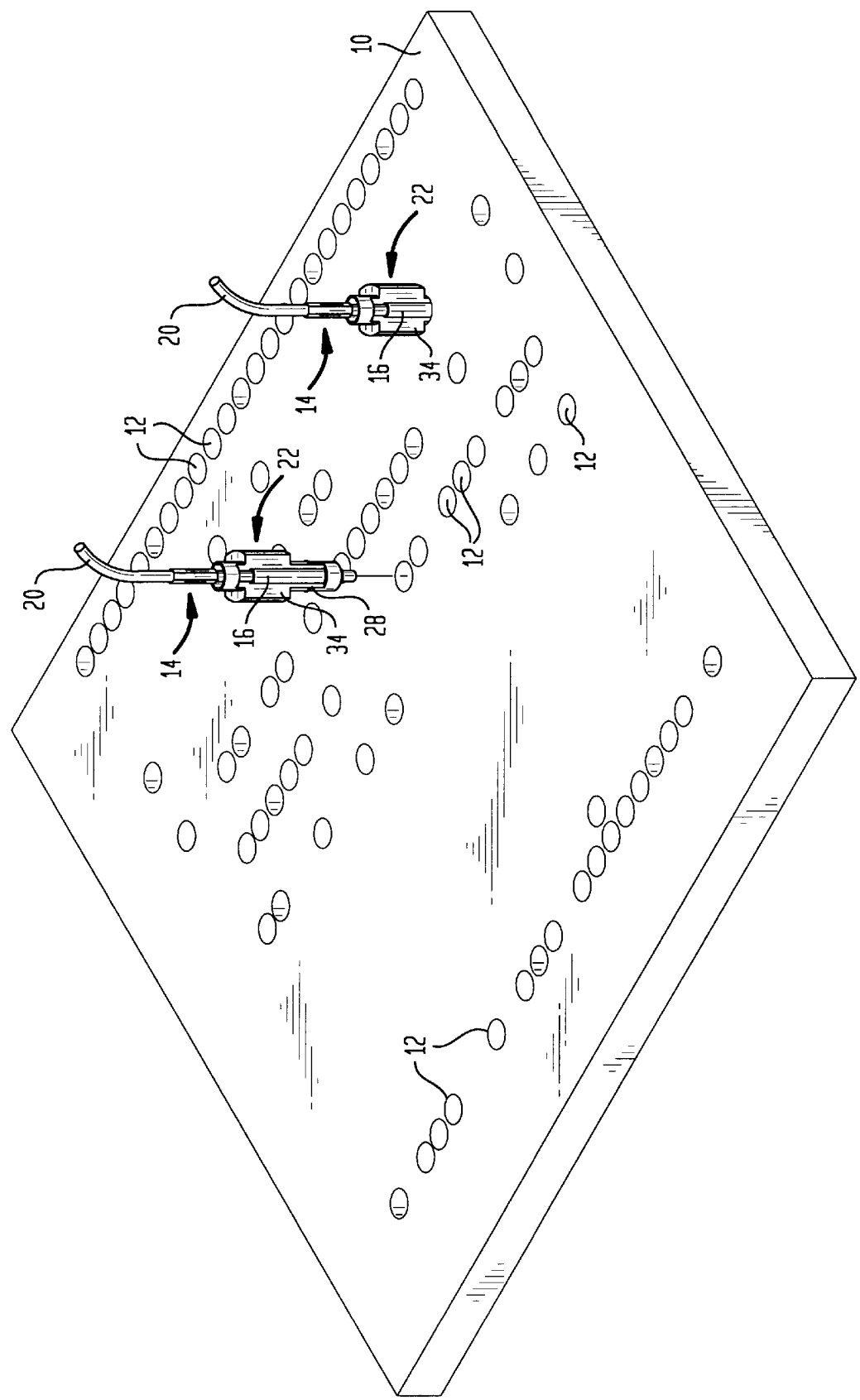

TEST PROBE RETAINER

BACKGROUND OF THE INVENTION

This invention relates to circuit board test fixtures and, more particularly, to a snap-in retainer for a test probe to be used with such a fixture.

Circuit boards are commonly tested by placing them in a test fixture and using one or more test probes at predetermined locations relative to the circuit board to evaluate circuit conditions at those locations. Toward that end, the test fixture typically includes a plate which is fixed relative to the circuit board. The plate is formed with a plurality of openings at various locations in registration with circuit board locations at which testing is to be done. The test probes are inserted through selected ones of the openings to effect the desired measurements. In the past, holding a test probe in an opening has been done in different ways. For example, it is known to press fit the test probe into an opening. With such an approach, it is difficult to assemble, remove and replace the test probe. It is also known to press fit the test probe into a retainer block and screw the retainer block to the test fixture plate. With this arrangement, tools are required to install and remove the test probe and it is also time consuming. In addition, both of the aforedescribed arrangements provide a risk that the test probe can be damaged when it is press fit into either the test fixture plate or the retainer block. It would therefore be desirable to provide a retainer for a test probe which overcomes the aforedescribed disadvantages.

In a particular application, the test fixture plate has a large number of openings closely spaced in a limited area. It is also required to move the test probes from opening to opening. The use of the aforedescribed arrangements are unsuitable for such an application, since the press fitting of the test probe into a plate opening presents obstacles to relocation of the test probe and the use of a retainer block takes up excessive space and is time consuming to move. It would therefore be desirable to provide an improved retainer which can be quickly moved from opening to opening without the use of any tools.

SUMMARY OF THE INVENTION

In accordance with the present invention, there is provided a retainer for removably securing a test probe or the like to a test fixture having a plate with at least one opening for receiving the test probe. The test probe has a cylindrical body with a forward end. The plate opening is circular and has a diameter larger tan the diameter of the cylindrical body of the test probe, and the plate opening is formed with a circumferential groove. The inventive retainer comprises a unitary member having a generally cylindrical central bore. The central bore has a diameter larger than the diameter of the test probe cylindrical body with a portion of the bore at a first end of the unitary member having a reduced diameter sized to snugly retain therein the forward end of the test probe cylindrical body. A forward section of the unitary member extends rearwardly from the first end and includes at least the reduced diameter portion of the bore. The forward section has an exterior configured for a snug fit within the plate opening. The unitary member has a circumferential bead on its exterior surface within the forward section and rearwardly of the reduced diameter portion of the bore, the bead being receivable in the circumferential groove of the plate opening.

In accordance with an aspect of this invention, the unitary member is further formed with an enlarged portion spaced rearwardly from the first end of the unitary member by a distance equal to the thickness of the plate. Accordingly, the enlarged portion functions as a stop during insertion of the retainer into the plate opening.

In accordance with another aspect of this invention, the unitary member is open to the central bore on opposed sides extending rearwardly from the rear of the reduced diameter portion to a region beyond the rear of the enlarged portion. Accordingly, compression of the enlarged portion toward the central bore moves the bead out of the groove to assist in removal of the member from the plate opening.

BRIEF DESCRIPTION OF THE DRAWINGS

The foregoing will be more readily apparent upon reading the following description in conjunction with the drawings in which like elements in different figures thereof are identified by the same reference numeral and wherein:

FIG. 1 is a perspective view of a test fixture plate holding a test probe retainer constructed according to the present invention with a second inventive test probe retainer being shown as separated from the plate, with each of the test probe retainers holding a respective test probe;

DETAILED DESCRIPTION

Figure 4:
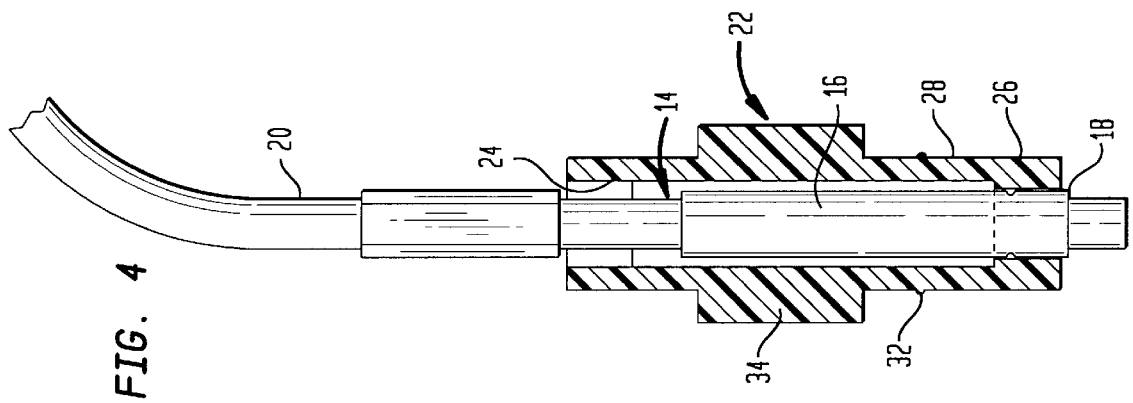
FIG. 4 is a longitudinal cross sectional view of the inventive test probe retainer shown in FIG. 2.
Figure 3:
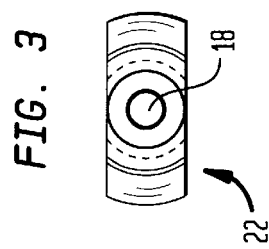
FIG. 3 is an end view of the inventive test probe retainer shown in FIG. 2.
Figure 2:
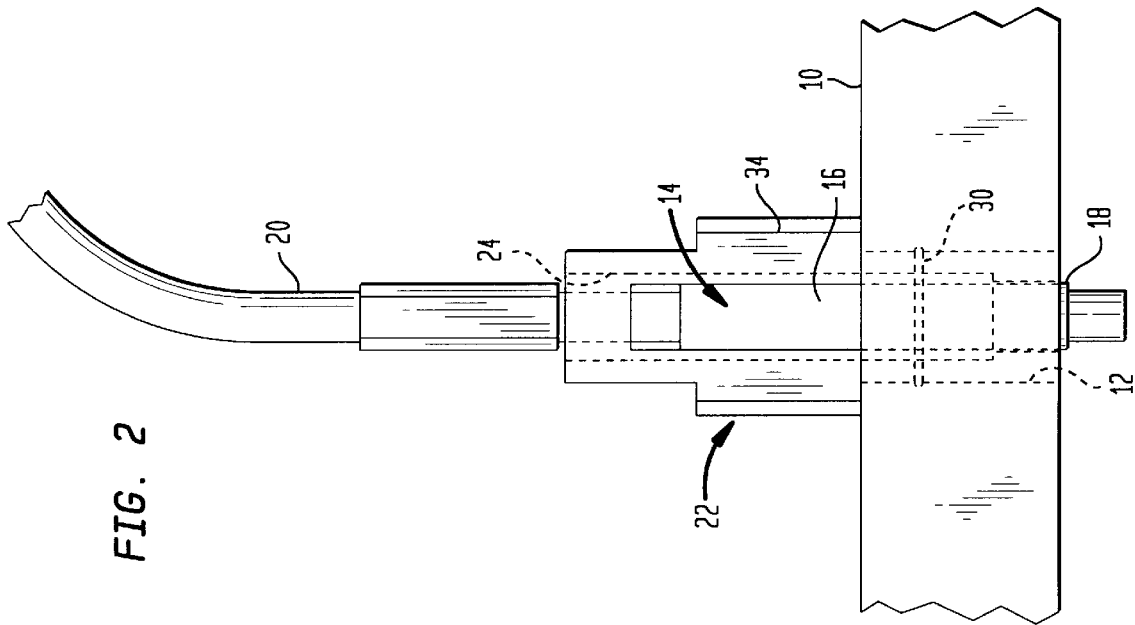
FIG. 2 is a side view showing an inventive test probe retainer held in a plate opening and holding a test probe.

Referring now to the drawings, FIG. 1 shows a test fixture plate 10 adapted to overlie a printed circuit board (not shown) undergoing testing. The relative positions of the plate 10 and the printed circuit board being tested are fixed, so that the openings 12 in the plate 10 are in registration with predetermined locations on the printed circuit board at which testing is to be effected. Such testing is effected utilizing a test probe 14, illustratively a coaxial probe Model No. 100304-00, manufactured by Interconnect Devices Inc. of Kansas City, Kans. As best shown in FIG. 4, the test probe 14 has a cylindrical body 16 with a forward end 18. The test probe 14 is connected to a coaxial lead 20 for conducting signals from the circuit board to test electronics (not shown).

According to the present invention, there is provided a retainer for the test probe 14 which allows the test probe 14 to be inserted into, or removed from, any of the openings 12 in the plate 10 as a one-handed operation without requiring screws, brackets or any tools. The test probe retainer 22 is a unitary member which may be fabricated from many different materials. Thus, the retainer 22 can be molded plastic, either insulating or conductive, machined plastic, either insulating or conductive, or molded or machined metal. As shown, the retainer 22 has a generally cylindrical central bore 24 which has a diameter larger than the diameter of the test probe cylindrical body 16 along the length of the retainer 22 with the exception that at a first end 26 of the retainer 22 the bore 24 has a reduced diameter sized to retain snugly therein the forward end 18 of the test probe cylindrical body 16. Extending rearwardly from the first end 26 of the retainer 22, a forward section 28 of the retainer 22 has an exterior configured for a snug fit within the opening 12 of the plate. The opening 12 is formed with a circumferential groove 30 and the forward section 28 of the retainer 22 is formed with a circumferential bead 32 rearwardly of the reduced diameter portion of the bore 24. The retainer 22 is further formed with an enlarged portion 34 spaced rearwardly from the first end 26 of the retainer by a distance equal to the thickness of the plate 10. The retainer 22 is initially formed as a stepped cylinder, i.e., it is circular in cross section orthogonal to its longitudinal axis. However, the stepped cylindrical shape is modified by slicing the retainer 22 on opposed sides from the rear of the reduced diameter portion of the bore 22 rearwardly beyond the enlarged portion 34 so as to expose the bore 24. This provides room for compression of the enlarged portion 34 toward the central bore 24. Thus, the retainer 22 is generally planar on those two opposed sides.

In use, a test probe 14 is installed in a retainer 22 with its forward end captured in the reduced diameter portion of the bore 24. When it is desired to install the test probe 14 in a plate opening 12, the retainer 22 is inserted into the selected opening 12 and moved inwardly until the enlarged portion 34 abuts the surface of the plate 10. The dimensions of the opening 12 and the retainer 22 are such that when the enlarged portion 34 abuts the surface of the plate 10, the bead 32 is seated in the groove 30. When it is desired to remove the test probe 14, the opposed enlarged portions 34 are squeezed together, with play being provided by the open sides of the bore 24 and the space between the cylindrical body 16 of the test probe 14 and the wall of the bore 24. This squeezing of the enlarged portion 34 causes the bead 32 to be moved out of the groove 30, thereby allowing the retainer 22 to be pulled out of the opening 12.

Accordingly, there has been disclosed an improved test probe retainer. This retainer possesses a number of advantages. Thus, the inventive retainer eliminates the need for screws and/or special brackets. It is of simple one piece construction and its slim profile fits into tight locations. It is easy to assemble and disassemble by hand, with no special tools being required. In addition, the retainer gives strain relief to the probe and the probe is not damaged when it is removed from the test fixture plate. The inventive retainer maintains a high level of tolerance at multiple locations and fewer test probes are required to test many locations, since the test probe can be plugged in and unplugged very conveniently. The use of the inventive retainer allows an easy replacement of worn or broken test probes. In addition to the use of the inventive retainer with a coaxial test probe of the type disclosed, it can also be used in other applications, such as, for example, inserting thermocouples.

Thus, while an illustrative embodiment of the present invention has been disclosed herein, it is understood that various adaptations and modifications to the disclosed embodiment are possible and it is intended that this invention be limited only by the scope of the appended claims.

What is claimed is:

1. A retainer for removably securing a test probe or the like to a test fixture having a plate with at least one opening for receiving the test probe, the test probe having a cylindrical body with a forward end, the at least one plate opening being circular and having a diameter larger than the diameter of the cylindrical body, and the plate opening being formed with a circumferential groove, the retainer comprising:

a unitary member having a generally cylindrical central bore, said bore having a diameter larger than the diameter of said test probe cylindrical body with a portion of the bore at a first end of the unitary member having a reduced diameter sized to snugly retain therein the forward end of the test probe cylindrical body, a forward section of the unitary member extending rearwardly from said first end includes at least the reduced diameter portion of the bore and has an exterior configured for a snug fit within said plate opening, and the unitary member having a circumferential bead on its exterior surface within said forward section and rearwardly of the reduced diameter portion of the bore, the bead being receivable in the plate opening circumferential groove.

2. The retainer according to claim 1 wherein the unitary member is further formed with an enlarge ed portion spaced rearwardly from the first end of the unitary member by a distance equal to the thickness of the plate;

whereby the enlarged portion functions as a stop during insertion of the retainer into the plate opening.

3. The retainer according to claim 2 wherein the unitary member is open to the central bore on opposed sides extending rearwardly from the rear of the reduced diameter portion to a region beyond the rear of the enlarged portion;

whereby compression of the enlarged portion toward the central bore moves the bead out of the groove to assist in removal of the unitary member from the plate opening.

\* \* \* \* \*